(12) United States Patent
Mazur et al.

(10) Patent No.: US 8,603,902 B2
(45) Date of Patent: Dec. 10, 2013

(54) ENGINEERING FLAT SURFACES ON MATERIALS DOPED VIA PULSED LASER IRRADIATION

(75) Inventors: Eric Mazur, Concord, MA (US); Mark Winkler, Brooklyn, NY (US)

(73) Assignee: President and Fellows of Harvard College, Cambridge, MA (US)

( * ) Notice: Subject to any disclaimer, the term of this patent is extended or adjusted under 35 U.S.C. 154(b) by 488 days.

(21) Appl. No.: 12/864,967

(22) PCT Filed: Feb. 2, 2009

(86) PCT No.: PCT/US2009/032856
§ 371 (c)(1),
(2), (4) Date: Oct. 28, 2010

(87) PCT Pub. No.: WO2009/100015
PCT Pub. Date: Aug. 13, 2009

(65) Prior Publication Data
US 2011/0045244 A1    Feb. 24, 2011

Related U.S. Application Data

(60) Provisional application No. 61/025,101, filed on Jan. 31, 2008.

(51) Int. Cl.
*H01L 21/265* (2006.01)
(52) U.S. Cl.
USPC .................................................. 438/535
(58) Field of Classification Search
USPC .................................................. 438/535
See application file for complete search history.

(56) References Cited

U.S. PATENT DOCUMENTS

| 4,181,538 A | 1/1980 | Narayan et al. |
| 4,201,450 A | 5/1980 | Trapani |

(Continued)

FOREIGN PATENT DOCUMENTS

| CN | 101053065 A | 10/2007 |
| WO | 0131842 | 5/2001 |

(Continued)

OTHER PUBLICATIONS

Bentini et al., Surface doping of semiconductors by pulsed-laser irradiation in reactive atmosphere. Applied Physics A: Materials Science & Processing. 1988;45(4):317-324.

(Continued)

*Primary Examiner* — Zandra Smith
*Assistant Examiner* — Pamela E Perkins
(74) *Attorney, Agent, or Firm* — Reza Mollaaghababa; Thomas J. Engellenner; Pepper Hamilton LLP

(57) ABSTRACT

Methods and apparatus for processing a substrate (e.g., a semiconductor substrate) is disclosed that includes irradiating at least a portion of the substrate surface with a plurality of short radiation pulses while the surface portion is exposed to a dopant compound. The pulses are selected to have a fluence at the substrate surface that is greater than a melting fluence threshold (a minimum fluence needed for the radiation pulse to cause substrate melting) and less than an ablation fluence threshold (a minimum fluence needed for the radiation pulse to cause substrate ablation). In this manner a quantity of the dopant can be incorporated into the substrate while ensuring that the roughness of the substrate's surface is significantly less than the wavelength of the applied radiation pulses.

15 Claims, 8 Drawing Sheets

(56) References Cited

U.S. PATENT DOCUMENTS

| | | | |
|---|---|---|---|
| 4,277,793 A | 7/1981 | Webb et al. | |
| 4,703,996 A | 11/1987 | Glass et al. | |
| 4,773,944 A | 9/1988 | Nath et al. | |
| 4,965,784 A | 10/1990 | Land et al. | |
| 5,635,089 A | 6/1997 | Singh et al. | |
| 5,714,404 A | 2/1998 | Mitlitsky et al. | |
| 5,773,820 A | 6/1998 | Osajda et al. | |
| 5,898,672 A | 4/1999 | Ginzboorg | |
| 5,918,140 A | 6/1999 | Wickboldt et al. | |
| 5,995,606 A | 11/1999 | Civanlar et al. | |
| 6,048,588 A | 4/2000 | Engelsberg | |
| 6,128,379 A | 10/2000 | Smyk | |
| 6,242,291 B1 | 6/2001 | Kusumoto et al. | |
| 6,272,768 B1 | 8/2001 | Danese | |
| 6,372,536 B1 | 4/2002 | Fischer et al. | |
| 6,457,478 B1 | 10/2002 | Danese | |
| 6,486,046 B2 | 11/2002 | Fujimura et al. | |
| 6,734,455 B2 | 5/2004 | Li | |
| 6,876,003 B1 | 4/2005 | Nakamura et al. | |
| 6,897,118 B1* | 5/2005 | Poon et al. | 438/303 |
| 7,057,256 B2 | 6/2006 | Carey, III et al. | |
| 7,112,545 B1 | 9/2006 | Railkar et al. | |
| 7,211,214 B2 | 5/2007 | Chou | |
| 7,354,792 B2 | 4/2008 | Carey, III et al. | |
| 7,390,689 B2 | 6/2008 | Mazur et al. | |
| 7,442,629 B2 | 10/2008 | Mazur et al. | |
| 7,504,702 B2 | 3/2009 | Mazur et al. | |
| 7,586,601 B2 | 9/2009 | Ebstein | |
| 7,781,856 B2 | 8/2010 | Mazur et al. | |
| 7,816,220 B2 | 10/2010 | Mazur et al. | |
| 7,884,439 B2 | 2/2011 | Mazur et al. | |
| 7,884,446 B2 | 2/2011 | Mazur et al. | |
| 2002/0034845 A1 | 3/2002 | Fujimura et al. | |
| 2002/0126333 A1 | 9/2002 | Hosono et al. | |
| 2002/0176650 A1 | 11/2002 | Zhao et al. | |
| 2003/0025156 A1 | 2/2003 | Yamazaki et al. | |
| 2003/0029495 A1 | 2/2003 | Mazur et al. | |
| 2003/0132449 A1 | 7/2003 | Hosono et al. | |
| 2005/0032249 A1 | 2/2005 | Im et al. | |
| 2005/0127401 A1 | 6/2005 | Mazur et al. | |
| 2005/0226287 A1 | 10/2005 | Shah et al. | |
| 2006/0079062 A1 | 4/2006 | Mazur et al. | |
| 2006/0102901 A1 | 5/2006 | Im et al. | |
| 2007/0243701 A1* | 10/2007 | Ito et al. | 438/514 |
| 2007/0293056 A1* | 12/2007 | Setsuhara et al. | 438/795 |
| 2008/0026550 A1 | 1/2008 | Werner et al. | |
| 2009/0151785 A1 | 6/2009 | Naum et al. | |
| 2009/0179199 A1* | 7/2009 | Sano et al. | 257/43 |
| 2010/0171948 A1 | 7/2010 | Mazur et al. | |

FOREIGN PATENT DOCUMENTS

| | | |
|---|---|---|
| WO | 0135601 | 5/2001 |
| WO | 2006043690 A1 | 4/2006 |
| WO | 2006054758 A1 | 5/2006 |

OTHER PUBLICATIONS

Carey et al., In-situ doping of silicon using the gas immersion laser doping (GILD) process. Applied Surface Science. vol. 43, Issues 1-4, Dec. 2, 1989, pp. 325-332.

Chinese Office Action issued Dec. 13, 2011 for Application No. 200980103740.5 (16 Pages).

Extended European Search Report issued Oct. 27, 2011 for Application No. 09707607.9.

Sarnet et al., Laser doping for microelectronics and microtechnology. Proceedings of the European Materials Research Society 2004—Symposium N. Applied Surface Science, vol. 247, Issues 1-4, Jul. 15, 2005, pp. 537-544.

European Search Report for Application No. 09707607.9, issued Sep. 14, 2012.

Kim et al., Strong sub-band-gap infared absorption in silicon supersaturated with sulfur. Appl Phys Lett. Jun. 12, 2006;88(24):241902.

Tabbal et al., Formation of single crystal sulfur supersaturated silicon based junctions by pulsed laser melting. J Vacuum Sci Technol Part B. Oct. 18, 2007;25(6):1847-52.

* cited by examiner

NORMALIZED ABSORPTANCE

ENGINEERING FLAT SURFACES ON MATERIALS DOPED VIA PULSED LASER IRRADIATION

RELATED APPLICATION

The present invention claims priority to provisional application entitled "Engineering Flat Surfaces On Materials Doped Via Pulsed Laser Irradiation," filed on Jan. 31, 2008 and having a Ser. No. 61/025,101, which is herein incorporated by reference.

BACKGROUND

The present invention relates generally to methods for processing substrates, and the resultant substrates, by employing radiation pulses, and more particularly to such methods that allow introducing a dopant into a surface layer of the substrates.

A variety of techniques are utilized for doping semiconductor substrates. For example, crystalline silicon can be doped to about 1% atomic concentration via irradiation of silicon wafers with a train of femtosecond radiation pulses in the presence of a dopant-containing compound. For example, a silicon wafer can be doped with sulfur to about 1% atomic concentration by irradiating the wafer with femtosecond radiation pulses while exposed to a sulfur donor, such as $SF_6$. The resulting doped silicon can exhibit several highly desirable optoelectronic properties. For example, it can exhibit significant absorption of radiation wavelengths longer than about 1100 nm. In fact, such doped silicon can be utilized to fabricate silicon photodiodes that operate well into the infrared.

However, the known methods for producing such doping can also cause significant damage to the silicon wafers. For example, they can cause the formation of a quasiperiodic array of spikes and ridges on the silicon surface. Such surface structures can cause difficulties in utilizing the doped wafers in a variety of applications. For example, in case of photodetector fabrication, they can render the use of many traditional measurement and handling techniques, as well as manufacturing processes, difficult.

Accordingly, there is a need for improved methods for radiation processing of substrates, and particularly for improved methods of doping substrates. There is also a need for doped substrates exhibiting enhanced surface morphologies.

SUMMARY

In one aspect, the invention provides a method for processing a substrate (e.g., a semiconductor substrate) that includes irradiating at least a portion of the substrate surface with a plurality of short radiation pulses while the surface portion is in contact with a dopant compound. The pulses are selected to have a fluence at the substrate surface that is greater than a melting fluence threshold (a minimum fluence needed for the radiation pulse to cause substrate melting) and less than an ablation fluence threshold (a minimum fluence needed for the radiation pulse to cause substrate ablation), a quantity that may vary for different materials and laser parameters (e.g., central wavelength, pulse duration, etc). As discussed further below, in this manner a quantity of the dopant can be incorporated into the substrate while ensuring that the roughness of the substrate's surface is significantly less than the wavelength of the applied radiation pulses.

The pulses can have a temporal duration, e.g., in a range of about 100 femtoseconds to tens or hundreds of nanoseconds (e.g., 20 nanoseconds), or in a range about 100 femtoseconds to about 1 picosecond, e.g., in a range of about 100 femtoseconds to about 500 femtoseconds, though other pulse widths can also be utilized. The pulse energies can be, e.g., in a range of about 100 microjoules to about 10 millijoules, though other pulse energies can also be utilized. The pulse energy and spot size can be selected so as to obtain a desired radiation fluence at the surface.

In a related aspect, the dopant compound can be any of a gas, a fluid or a solid. Some examples of such dopant compounds can include $SF_6$, $N_2$, $Cl_2$, air, water, alcohol, $H_2S$, Sb, Se, Te, P, to name a few.

In another aspect, a method of introducing a dopant into a substrate (e.g., a semiconductor substrate) is disclosed that includes exposing at least a portion of a substrate surface to a material having a dopant constituent. The surface portion is irradiated with a plurality of temporally short laser pulses so as to cause incorporation of the dopant into a surface layer of the substrate. The laser pulses are configured such that following the irradiation the irradiated substrate surface exhibits a root-mean-square roughness that is less than about ⅛, and preferably less than about 1/32 and more preferably less than about 1/50, of the applied radiation wavelength (e.g., a central wavelength of the pulses).

In another aspect, the invention provides a method of incorporating a dopant into a substrate by exposing at least a portion of the substrate surface to a dopant compound and applying a plurality of short radiation pulses to a plurality of locations of that surface portion so as to cause melting of a surface layer of the substrate without causing ablation so as to incorporate a quantity of said dopant, e.g., at a density in a range of about $10^{13}$ $cm^{-3}$ to about $10^{21}$ $cm^{-3}$, or in a range of about $10^{14}$ $cm^{-3}$ to about $10^{21}$ $cm^{-3}$, or in a range of about $10^{15}$ $cm^{-3}$ to about $10^{21}$ $cm^{-3}$ into the surface layer.

In a related aspect, in the above method, the fluence of each pulses and the distribution of the pulses across the surface are selected such that following the application of the pulses the surface portion exhibits a root-mean-square roughness less than about $$\frac{\lambda}{50},$$

where $\lambda$ is the central wavelength of the laser pulse.

In another aspect, the invention provides a substrate (e.g., a semiconductor substrate) that includes a surface layer containing a dopant, where the surface layer has a top surface exhibiting a root-mean-square (RMS) roughness less than about 200 nanometers (nm), or less than about 100 nm, or less than about 50 nm, or preferably less than about 20 nm, or less than about 10 nm, e.g., in a range of about 10 nm to about 20 nm. In some cases, the RMS roughness can be greater than about 1 nm but less than about 10 nm. In some cases, the dopant density in the surface layer can be in a range of about $10^{13}$ $cm^{-3}$ to about $10^{21}$ $cm^{-3}$, or in a range of about $10^{14}$ $cm^{-3}$ to about $10^{21}$ $cm^{-3}$, or in a range of about $10^{15}$ $cm^3$ to about $10^{21}$ $cm^{-3}$. In some embodiments, the surface exhibits a high degree of specular reflection. For example, a large percentage of the light reflected from the surface has undergone specular reflection (e.g., at least about 80% or at least about 90% of the reflected light).

For example, the substrate can be a silicon wafer having a sulfur dopant layer with a flat top surface.

In yet another aspect, a method of processing a substrate (e.g., a semiconductor substrate) is disclosed that includes applying a plurality of laser pulses to different locations of a substrate surface, where the fluence and the spatial distribution of the pulses are selected so as to generate surface structures with a root-mean-square roughness less than about $$\frac{\lambda}{50},$$

where λ is the central wavelength of the laser pulse, e.g., in a range of about 5 nm to about 15 nm for an 800 nm central wavelength.

Further understanding of various aspects of the invention can be obtained by reference to the following detailed description together with the associated drawings, which are discussed briefly below.

DETAILED DESCRIPTION

Figure 1A:
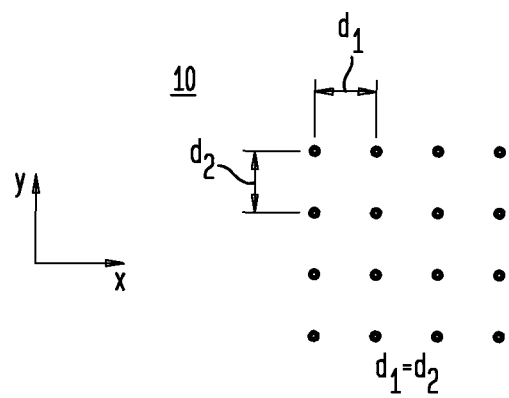
FIG. 1A schematically depicts an exemplary distribution of laser pulses across a substrate surface in accordance with one embodiment of the invention, FIG. 1B schematically depicts a distribution of laser pulses across a substrate surface in accordance with a conventional method of processing a substrate by applying radiation pulses thereto, FIG. 2A schematically depicts two spatially neighboring pulses applied to a substrate, FIG. 2B schematically depicts two spatially neighboring pulses applied to a substrate, where the pulses generate overlapping melting zones, and each individually causes ablation, FIG. 2C schematically depicts two spatially neighboring pulses applied to a substrate, where the pulses generate overlapping ablation and melting zones, FIG. 2D schematically depicts two spatially neighboring partially overlapping pulses applied to a substrate in accordance with an embodiment of the invention, where each pulse has a peak fluence between a melting fluence threshold and an ablation fluence threshold, FIG. 3 schematically depicts an apparatus suitable for performing substrate processing methods of the invention, FIGS. 4A and 4B schematically depict the deposition of pulses on a substrate in an exemplary implementation of a method according to an embodiment of the invention by moving the substrate relative to a beam of laser pulses.

The present invention generally relates to methods of processing a substrate (e.g., a semiconductor substrate) by applying radiation pulses to a surface of the substrate while the surface is in contact with a dopant so as to generate a doped layer extending from the top of the surface to a depth of the substrate while ensuring that the top surface exhibits a roughness that is significantly less than the wavelength of the applied radiation. For example, in some embodiments, the root-mean-square (RMS) roughness (root-mean-square of the height variation across the processed surface) can be less than about 200 nm, or preferably less than about 100 nm, or less than about 50 nm, or less than about 20 nm, or less than about 10 nm, e.g., in a range of about 10 to about 20 nm. In other words, the processing methods of the invention allow generating a doped substrate via radiation (laser) processing having flat surfaces. The term "a flat surface," as used herein, refers to a surface that exhibits an RMS roughness less than about 200 nm, or less than about 100 nm, or less than about 50, or preferably less than about 20 nm, e.g., in a range of about 10 nm to about 20 nm, or greater than about 1 nm and less than about 10 nm. In some embodiments, a laser processing method of the invention includes applying short radiation pulses to a substrate surface, while the surface is in contact with a dopant (or more generally in contact with a material having a dopant constituent), with a fluence at the surface that is sufficiently high to cause melting but is less than a threshold fluence needed for ablation. Various portions of the surface can be treated in this manner (e.g., by moving the surface relative to the radiation pulses) so as to generate a macroscopic doping layer below a top flat surface of the substrate. As discussed further below, in some cases, the radiation pulses are distributed across the surface such that each processed surface region undergoes melting, but not ablation. While the various features of the invention are discussed with respect to doping a substrate, the teachings of the invention regarding the fluence of the radiation pulses can also be utilized for processing substrate in absence of doping. Further, although many embodiments are discussed in connection with semiconductor substrate, the teachings of the invention can be applied to other types of substrates, such as glasses, metals, alloys, or organic compounds.

In an exemplary method according to an embodiment of the invention for processing a substrate (e.g., a semiconductor substrate such as silicon) includes irradiating one or more portions of a surface of the substrate with one or more short radiation pulses. The phrase "short radiation pulses," as used herein, can refer to pulses of electromagnetic radiation having temporal durations in a range of about 10 femtoseconds (one femtosecond is defined as $10^{-15}$ seconds) to about hundreds of nanoseconds (one nanosecond is defined as $10^{-9}$ seconds), e.g., in a range of about 10 femtoseconds to about 1 picosecond, or in a range of about 100 femtoseconds to about 500 femtoseconds. In many embodiments, the irradiation of the surface is carried out while the surface (or at least the portion exposed to radiation) is in contact with a dopant compound (e.g., a material having a dopant constituent) so as to cause incorporation of a quantity of the dopant into a surface layer of the substrate (e.g., a surface layer having a thickness in a range of about 10 nm to about 1000 nm, e.g., in a range of about 10 nm to about 500 nm). Such a material can be a liquid, a gas or a solid. By way of example, in some cases the surface is irradiated while in contact with $SF_6$ to incorporate a quantity of sulfur in a top surface layer, while in some other cases the surface is irradiated while in contact with a liquid, such as water or alcohol, or a solid.

In many cases, the fluence of each radiation pulse (denoted herein by F) at the substrate's surface, which is defined as radiation energy per unit area, is selected to have a maximum (peak) value that exceeds a melting fluence threshold (a minimum fluence needed to cause melting) but remains less than an ablation fluence threshold (a minimum fluence needed to cause ablation). In other words, the energy of each radiation pulse and its spot size on the substrate's surface are controlled to ensure that each surface portion to which a radiation pulse is applied is exposed to laser irradiation having a fluence that exceeds the melting threshold but remains below the ablation threshold. In many embodiments, this requirement regarding the radiation fluence is maintained during the entire irradiation process. In other cases, at least about 60%, or 70%, or 80% or preferably 90% of the pulses applied to the substrate exhibit such a fluence.

The terms "melting" and "ablation" are known in the art. To the extent that any further explanation may be needed, "melting" generally refers to a process that results in a phase change of a substance from a solid phase to a liquid phase, e.g., via increasing internal energy of the substrate by application of heat, and "ablation" generally refers to the removal of material from a surface of a substrate by vaporization, chipping or other erosive processes.

To illustrate the above requirement imposed on the radiation fluence mathematically, a function ($F_{peak}(x,y)$) can be defined to indicate a maximum radiation fluence from a radiation pulse to which any surface point (x,y) is exposed, where ($F_{peak}(x,y)$) satisfies the following relation:

$$F_{melt} < F_{peak}(x,y) < F_{ablation} \quad \text{Eq. (1)}$$

wherein $F_{melt}$ denotes a radiation fluence threshold for melting of a substrate portion exposed to the radiation and $F_{ablation}$ denotes a radiation fluence threshold for causing ablation of a substrate portion exposed to radiation.

Another way of considering the above requirement regarding the radiation fluence is to define the following piecewise $$U(x, y) = \begin{cases} 0 & \text{if } F_{peak}(x, y) < F_{melt} \\ 1 & \text{if } F_{melt} < F_{peak}(x, y) < F_{ablation} \\ 2 & \text{if } F_{ablation} < F_{peak}(x, y) \end{cases} \quad \text{Eq. (2)}$$

where in many embodiments the pulse distribution on the substrate surface is such that $U(x,y)=1$ at all irradiated points. For example, a point (x,y) at which $U(x,y)=2$ would be ablated, which is undesirable, while any point (x,y) at which $U(x,y)=0$ would not be melted, which is also undesirable.

The radiation fluence thresholds for ablation and/or melting for a given material can depend on the wavelength of applied radiation as well as the temporal duration of the applied radiation pulses. Hence, the above requirement regarding the fluence of the applied radiation relative to the melting and ablation thresholds, as embodied for example in Equations (1) and (2), applies for a given radiation wavelength and pulse duration. By way of example, in an embodiment of the invention in which 100 fs radiation pulses having a central wavelength of about 800 nm are applied to a substrate surface (e.g., silicon), the peak fluence of each pulse is selected to be above a fluence needed to cause melting of the substrate by applying a 100-fs radiation pulse having a central wavelength of 800 nm to the substrate. Further, the peak fluence of the pulse is selected to be less than a fluence needed to ablate the substrate by applying a 100-fs radiation pulse having a central wavelength of 800 nm to the substrate.

It should also be understood that the determination of the melting and/or ablation fluence thresholds of a material can involve measurement uncertainties. Hence, in many cases, such measurement uncertainties should be taken into account when considering whether the fluence of a radiation pulse satisfies the above relations.

In some embodiments, a plurality of radiation pulses can be applied to different substrate locations (spots) and distributed over a macroscopic area of the surface so as to treat the entire area. In some cases, the peak fluence of the pulses as well as the overlap between spatially adjacent pulses are selected so as to cause melting, but not ablation, of each treated substrate location. In some embodiments, the number of radiation pulses applied to each surface spot (location) can vary from one to about a few thousands, e.g., it can be in a range of about 10 to about 200 pulses. As noted above, such irradiation of the surface can be performed while the surface is in contact with a dopant (e.g., a material having a dopant constituent) to cause incorporation of a quantity of the dopant into the substrate. To ensure substantially uniform doping, in many embodiments the variation of total energy deposited at different locations on the surface can be minimized, e.g., by proper selection of the pulse shapes and the way the pulses are distributed across the surface.

By way of example, in some cases, the pulses are spatially distributed across the surface to form a square or a triangular lattice of "target points" (a lattice corresponding to the centers of the laser spots). For example, FIG. 1A schematically depicts a square grid 10 (while a triangular grid may be more desirable in some cases, a rectangular grid is shown here for simplicity) representing the points on the substrate surface at which the centers of laser pulses strike the surface. In the grid 10, the distance between centers of spatially adjacent pulses in one dimension (e.g., $d_1$ in the horizontal dimension) is substantially similar to the distance between the centers of the pulses in the other dimension (e.g., $d_2$ in the vertical dimension). In other words, in this case $d_1=d_2$.

Figure 1B:
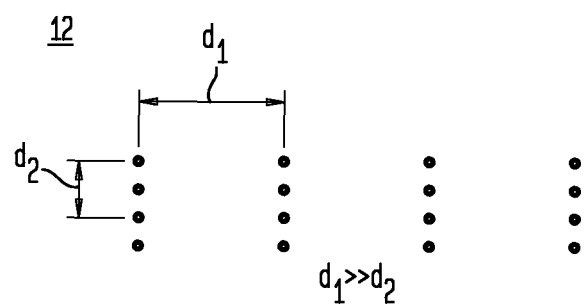

The distribution of the pulses across the surface according to such a rectangular pattern represents a significant departure from conventional patterns of pulse distribution for structuring a substrate surface. Such conventional patterns are typically designed to most efficiently raster a radiation beam across the surface. For example, FIG. 1B schematically depicts such a conventional pattern 12 of target points in which the radiation pulses are significantly closer spatially to one another in one dimension than in the other. For example, in this case $d_1 \gg d_2$ with typical a ratio of $d_1/d_2$ lying in a range of about 10 to about 100.

Figure 2A:
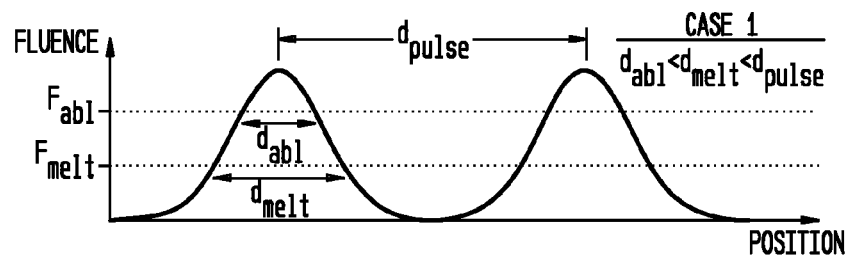

With reference to FIGS. 2A-2D, by way of further illustration of salient aspects of the invention, the fluence as well as placement of two spatially adjacent radiation pulses in one exemplary embodiment are compared with the fluence and placement of two adjacent pulses in a conventional method for processing (e.g., structuring and/or doping) a substrate's surface. FIG. 2A simply demonstrates various parameters of interest associated with two neighboring pulses, such as $d_{melt}$ (a linear spatial extent of a melting zone associated with the pulse), $d_{abl}$ (a linear spatial extent of an ablation zone associated with the pulse) and $d_{pulse}$ (the distance between the centers of the pulses).

Figure 2B:
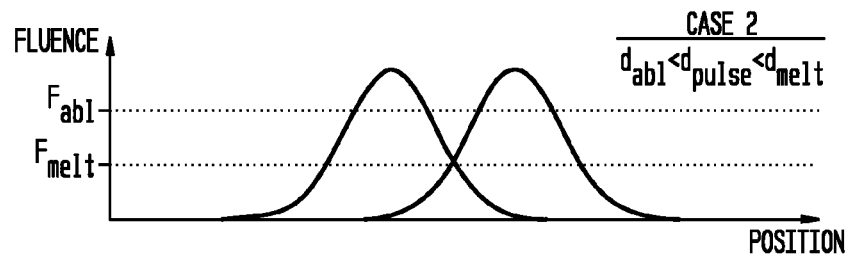
Figure 2C:
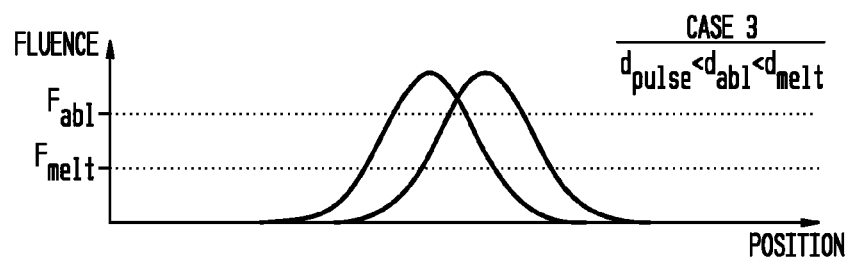
Figure 2D:
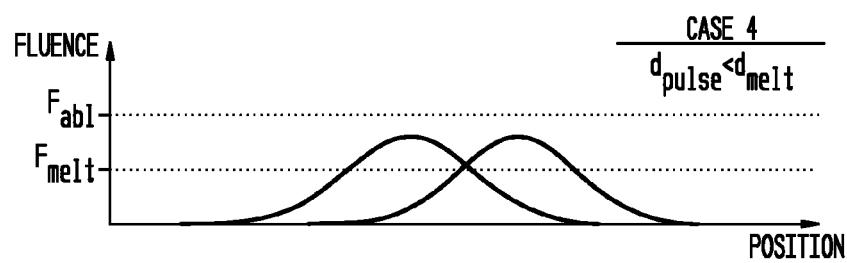

FIG. 2B schematically shows two pulses each having a peak fluence that is greater than the ablation threshold fluence. These pulses have overlapping melting zones but separated (non-overlapping) ablation zones. FIG. 2C schematically shows two pulses each having a peak fluence that is greater than the ablation threshold fluence arranged relative to one another to have overlapping melting and ablation zones. Many conventional laser processing techniques utilize the fluence and pulse distribution shown in FIG. 2B along one dimension of a sample surface and employ the fluence and pulse distribution shown in FIG. 2C along another dimension (e.g., an orthogonal dimension) of the surface. In contrast, FIG. 2D shows the fluence and pulse distribution employed in an embodiment of the invention for processing (e.g., doping) a substrate in which the peak fluence of each pulse lies in a range between a fluence needed to cause melting and a fluence needed to cause ablation. Further, the pulses are distributed such that neighboring pulses overlap in a manner that would cause melting, but not ablation, of each surface region subjected to laser processing. The conditions depicted in FIG. 2D apply to both the x and y dimensions.

As discussed further below, the method of the invention for processing a substrate (e.g., a semiconductor substrate) can result in a substrate having a doped surface layer with the surface exhibiting a root-mean-square roughness less than about 200 nm, or less than about 100 nm, or less than about 50 nm, or less than about 20 nm, or less than about 10 nm, e.g., greater than about in a range of about 10 nm to about 20 nm. In some cases, the surface can include a root-mean-square roughness that is greater than about 1 nm and less than about 10 nm. In other words, the top surface can be flat while also having a doped surface layer that extends from the top surface into a depth of the substrate. In some cases, the doped surface layer can have a thickness, e.g., in a range of about 10 nm to about 1000 nm, or in a range of about 10 nm to about 500 nm. Further the concentration of a dopant incorporated into such a surface layer can vary based on the conditions utilized, e.g., from about $10^{15}$ cm$^{-3}$ to about $10^{21}$ cm$^{-3}$.

Such substrates formed in accordance with the teachings of the invention can find a variety of applications. For example, they can be utilized in photodetectors, solar cells, semiconductor laser, CCDs, light-emitting diodes, or any other optoelectronic device. For example, the following example shows that the method of the invention can be used to generate a flat silicon substrate having a surface layer in which a significant quantity of sulfur is doped. Such a doped flat silicon can exhibit a significant increase in infrared absorptance relative to unprocessed silicon. As such, it can be utilized in photodetectors for not only visible but also infrared detection of radiation.

Figure 3:
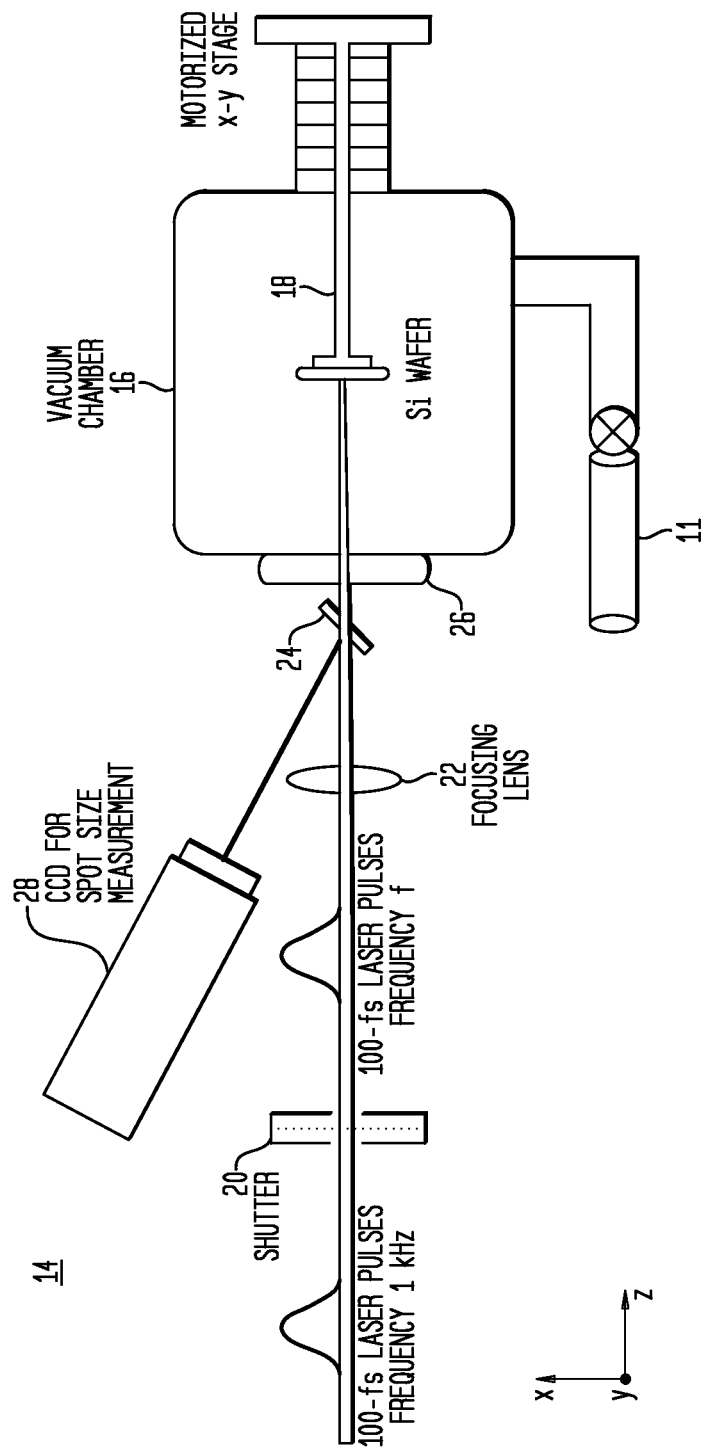

An exemplary apparatus 14 for performing substrate processing according to the teachings of the invention is shown schematically in FIG. 3. The apparatus 14 includes a sample processing chamber 16 in which a translation stage 18 is disposed. A sample under processing can be mounted to the translation stage. A regeneratively amplified, femtosecond Ti:Sapphire laser system (not shown) provides approximately 100 fs laser pulses having a central wavelength of 800 nm at a repetition rate of 1 kHz. A shutter 20 can be utilized to adjust the repetition rate to a different value. A focusing lens 22 receives the laser pulses and directs them through a beam splitter 24 to a radiation transmissive window 26 (e.g., a quartz window) of the chamber. A portion of the radiation energy is reflected from the beam splitter onto a CCD 28 for spot size measurement. The spot size of the pulses at the sample can be varied by moving the lens (e.g., from a spot size diameter of about 10 microns to about 1000 microns). The energy of the pulses generated by the laser system can be, e.g., up to about 2.5 millijoules. The energy of the pulses can be adjusted, e.g., by using one or more neutral density filters, or a half-wave plate and a polarizer, to be within a desired range. The variation of the pulse energy and/or the spot size at the sample can be employed to adjust the radiation fluence at the sample to a selected value. A dopant compound can be introduced from a dopant source 11 into the evacuated chamber so as to expose the surface of the sample to the dopant compound while the surface is irradiated with pulsed radiation. Further details regarding an apparatus suitable for use in practicing the methods of the invention can be found in U.S. Pat. No. 7,057,256 entitled "Silicon-Based Visible and Near-Infrared Optoelectric Device," which is herein incorporated by reference.

Although the above embodiments are discussed in connection with doping a substrate, the teachings of the invention, such as various way of overlapping laser pulses applied to a substrate surface, can be more generally utilized to process a variety of substrates in a variety of laser processing applications. Some examples of such laser processing applications can include, without limitation, pulsed laser annealing, pulsed laser melting and recrystallization. For example, a substrate surface (e.g., a semiconductor surface) can be irradiated with a plurality of short radiation pulses with at least some of the pulses, an in some cases each pulse, having a fluence at the substrate surface greater than a melting fluence threshold and less than an ablation fluence threshold. In one application, the substrate melting can be followed by resolidification to provide annealing of the substrate.

The following example is provided to further elucidate various aspects of the invention. The example is provided only for illustrative purposes and is not intended to necessarily indicate the optimal results that can be achieved by practicing the invention.

EXAMPLE

A (111) Si wafer, doped n-type with phosphorus to a resistivity of ρ=800-900 Ω-cm was prepared. The silicon surface was cleaned using ultrasonic cleaning in acetone, methanol, isopropanol, and deionized water. Any native oxide was removed using an 60 s dip in HF 5%.

The wafer was then exposed to a train of 800 nm, 100 femtosecond laser pulses from a Ti:Sapphire, regeneratively-amplified laser system. The pulse train from the laser system has a 1 kHz repetition rate.

Figure 4A:
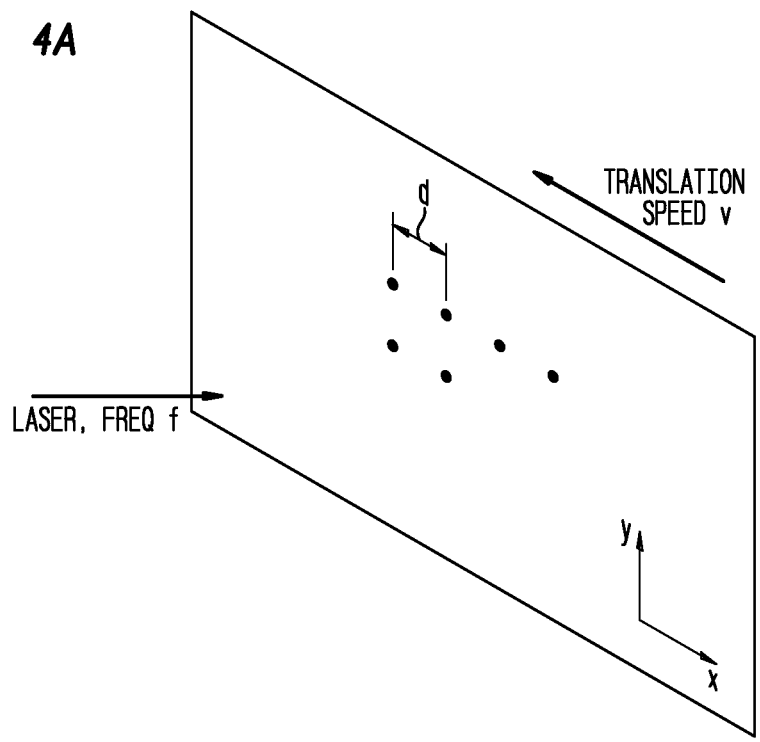
Figure 4B:
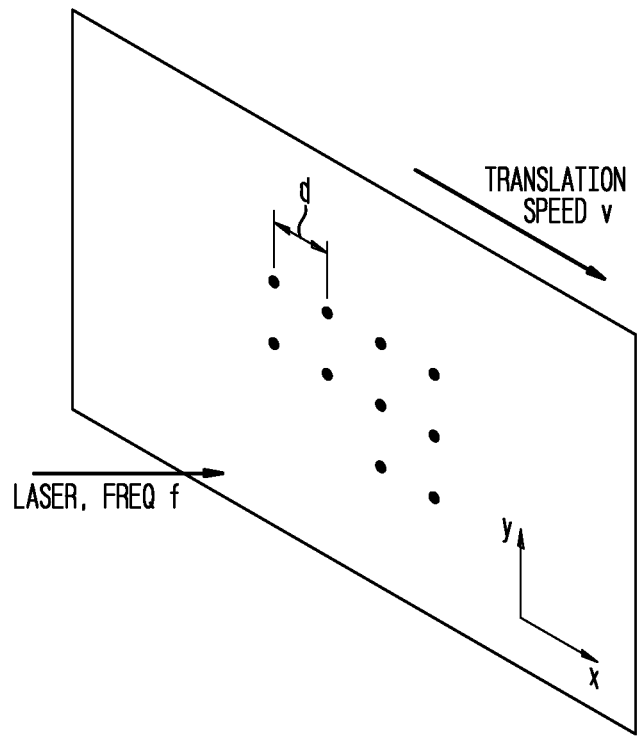

The experimental setup for femtosecond laser processing (doping) of the wafer is shown in FIG. 3 discussed above. The silicon wafer was placed in a vacuum chamber. The chamber was evacuated to <$10^{-3}$ torr, and backfilled with 500 torr of SF$_6$ (for sulfur doping). The 1-kHz pulse train repetition rate was reduced to a frequency f=11 Hz using the mechanical shutter 20. The silicon wafer was translated in front of the laser beam at a speed v (in this case about 640 micrometers/second) in the x-direction, yielding an x-spacing between laser pulses of d=v/f (in this case about 58 micrometers). After traveling some distance (e.g., about 3 cm in this case), the sample was then stepped an identical distance d in the y-direction and then translated in the reverse x-direction. By repeating this process, pulses were distributed onto a square grid on an extended area of the surface of the silicon wafer (see FIGS. 4A and 4B).

Figure 5:
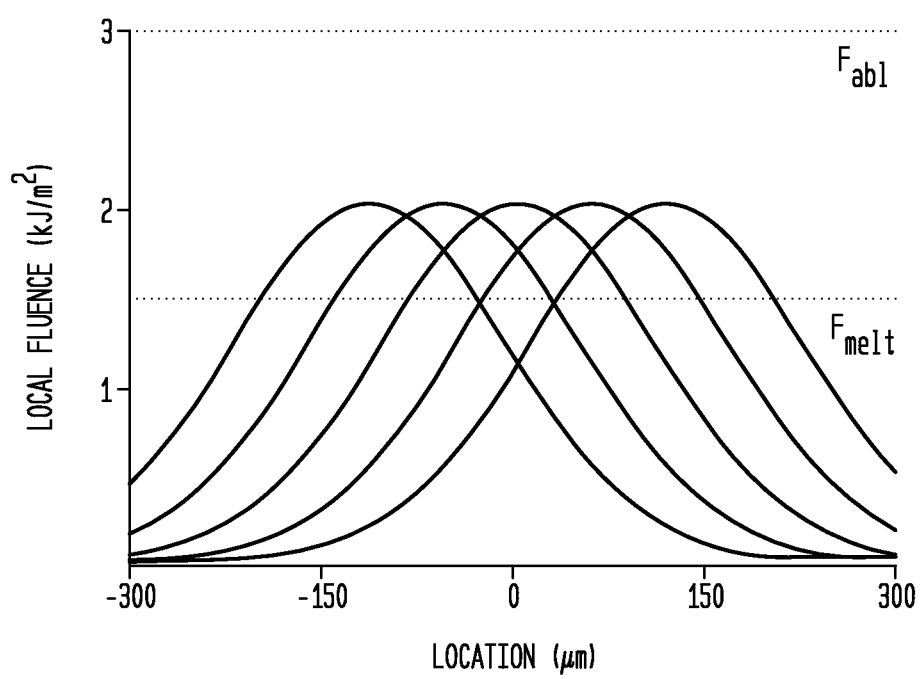
FIG. 5 shows, along one of two spatial dimensions, the overlap of neighboring pulses applied to a silicon substrate in an exemplary implementation of a method according to an embodiment of the invention.

The laser beam was focused onto the surface of the silicon wafer to a spot size w, where w refers to the width of the beam at half of its maximum intensity; this size can be measured using a CCD camera, and can be used to calculate fluence. Fluence is the physical quantity traditionally used to denote important thresholds for laser induced phase changes. Average fluence is calculated by dividing the energy in a pulse by the area over which the pulse intensity exceeds 1/e of the maximum. Calculated in this fashion for a pulse with a Gaussian intensity profile, average fluence has the convenient property that it has the same value as peak fluence. For femtosecond laser pulses, silicon's melting fluence threshold is about 1.5 kJ/m$^2$, and its ablation fluence threshold is about 3 kJ/m$^2$. To satisfy the requirements discussed above for generating a flat surface, an average fluence of 2 kJ/m$^2$ was chosen. The pulse size was w=250 μm; the pulses were spaced in the x- and y-directions by 58 μm (accomplished with raster speed v=640 μm/s and pulse repetition rate of f=11 Hz. FIG. 5 schematically show that this choice of parameters corresponds to the type of pulse fluence and arrangement shown above in FIG. 2D in connection of an exemplary embodiment of the invention.

Figure 6:
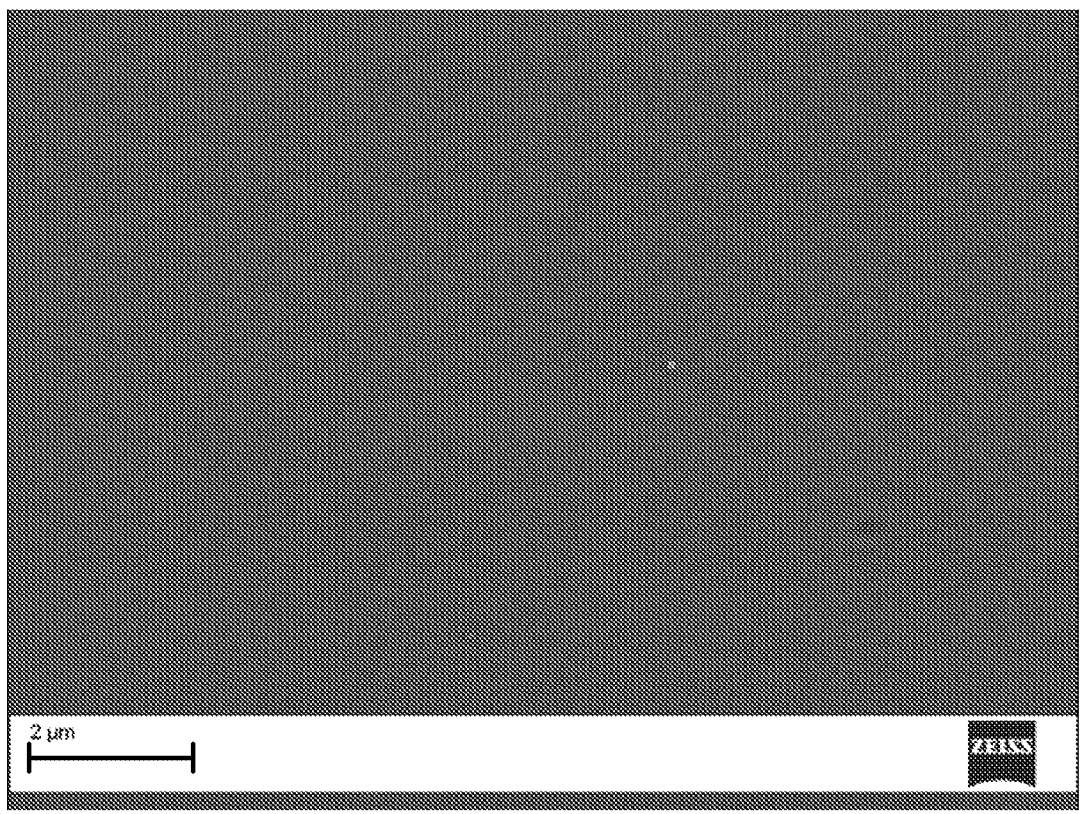
FIG. 6 is an SEM image of a silicon substrate processed in accordance with an embodiment of a method of the invention.
Figure 7:
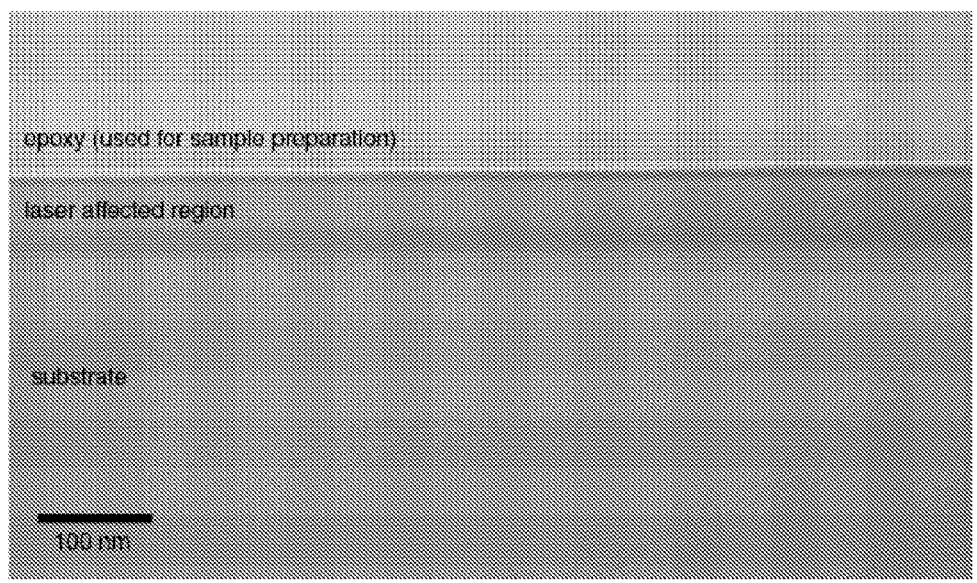
FIG. 7 is a TEM image of a silicon substrate processed in accordance with an embodiment of a method of the invention.

After laser processing, the sample retained the highly-polished appearance of the original sample. A closer inspection under a scanning electron microscope revealed no visible roughness, although there was some minor surface height variation (FIG. 6). Additionally, a cross-sectional bright-field TEM image demonstrated that a well-defined laser-altered region was created that extended about 50 nm from the surface, as shown in FIG. 7. The contrast in the TEM image can result from a change in crystal structure due to melting and resolidification, an observation confirmed by selected area diffraction as well as higher magnification TEM inspection.

Figure 8:
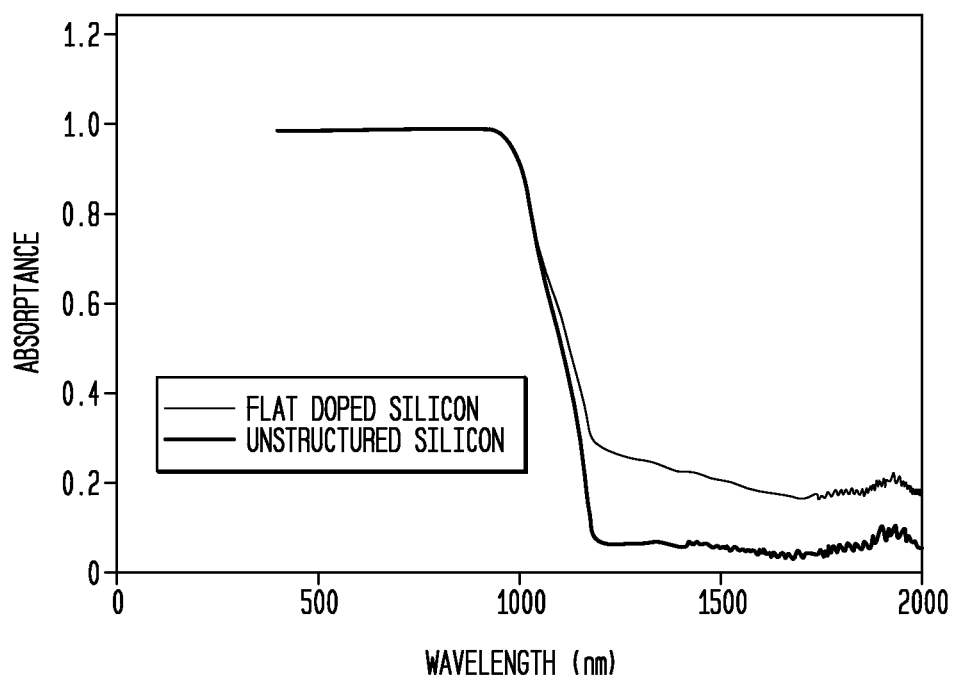
FIG. 8 shows normalized absorptance of a prototype silicon sample processed in accordance with an embodiment of a method of the invention.

By way of illustration, FIG. 8 shows some optical properties of the prototype flat processed silicon sample: an increase in the infrared absorptance at optical wavelengths greater than about 1100 nm ($\lambda$>1100) was observed. In particular, the processed prototype sample demonstrates a significant increase in infrared absorptance relative to unprocessed crystalline silicon. This increase in the infrared absorptance indicates high levels of sulfur doping in a top surface layer of the processed sample. The increase in the infrared absorptance exhibited by the processed prototype sample is less than the increase exhibited by laser-doped silicon produced by some conventional techniques. This can be due to a thinner top surface layer in the prototype sample (e.g., a layer having a thickness of about 40 nm) in which sulfur is incorporated relative to a respective layer formed by the conventional techniques (e.g., a layer having a thickness of about 200 nm).

Those having ordinary skill in the art will appreciate that various changes can be made to the above embodiments without departing from the scope of the invention.

What is claimed is:

1. A method of introducing a dopant into a substrate, comprising placing at least a portion of a substrate surface in contact with a material having a dopant constituent, and irradiating said surface portion with a plurality of short laser pulses so as to cause incorporation of said dopant constituent into a surface layer of the substrate, wherein said short laser pulses are configured such that following said irradiation step the irradiated substrate surface exhibits a root-mean-square roughness less than about 1/30 of a central wavelength of said pulses.

2. The method of claim 1, wherein said material having a dopant constituent comprises any of a gas, a fluid or a solid.

3. The method of claim 1, wherein said material having a dopant constituent comprises $SF_6$.

4. The method of claim 1, wherein said short laser pulses have temporal durations in a range of about 100 femtoseconds to about tens of nanoseconds.

5. The method of claim 1, wherein said substrate comprises any of a semiconductor, glass, metal, alloy or an organic compound.

6. The method of claim 1, wherein said incorporated dopant constituent has a density in a range of about $10^{13}$ cm$^{-3}$ to about $10^{21}$ cm$^{-3}$.

7. A method of incorporating a dopant into a substrate, comprising placing at least a portion of a substrate surface in contact with a dopant material, applying a plurality of short radiation pulses to a plurality of locations of said surface portion so as to cause melting of a surface layer of the substrate without causing ablation so as to incorporate a quantity of said dopant into said surface layer, wherein a fluence of each pulse and a distribution of the pulses over the surface are selected such that following the application of the pulses said surface portion exhibits a root-mean-square roughness less than about 1/30 of a central wavelength of said pulses.

8. The method of claim 7, wherein said incorporated dopant has a density in a range of about $10^{13}$ cm$^{-3}$ to about $10^{21}$ cm$^{-3}$.

9. The method of claim 7, wherein said dopant material comprises any of a gas, a fluid or a solid.

10. The method of claim 7, wherein said dopant material comprise $SF_6$.

11. The method of claim 7, wherein said short radiation pulses have temporal durations in a range of about 100 femtoseconds to about tens of nanoseconds.

12. The method of claim 7, wherein said substrate comprises any of a semiconductor, glass, metal, alloy or an organic compound.

13. A method of processing a substrate, comprising irradiating at least a portion of a substrate surface with a plurality of short radiation pulses, said pulses having a fluence at the substrate surface greater than a melting fluence threshold and less than an ablation fluence threshold, wherein the spatial distribution of the pulses over the substrate surface is selected so as to provide surface structures with a root-mean-square roughness less than about $\lambda/50$, where $\lambda$ is the central wavelength of the laser pulses.

14. The method of claim 13, wherein said short laser pulses have temporal durations in a range of about 100 femtoseconds to about tens of nanoseconds.

15. The method of claim 13, wherein said substrate comprises any of a semiconductor, glass, metal, alloy or organic compound.

* * * * *